United States Patent [19]
Prentice

[11] Patent Number: 5,812,029
[45] Date of Patent: Sep. 22, 1998

[54] GAIN CONTROL CIRCUIT AND METHOD

[75] Inventor: John S. Prentice, Palm Bay, Fla.

[73] Assignee: Harris Corporation, Melbourne, Fla.

[21] Appl. No.: 725,924

[22] Filed: Oct. 4, 1996

[51] Int. Cl.⁶ .............................. H03G 3/30; H03F 3/45
[52] U.S. Cl. ....................... 330/278; 330/288; 330/254
[58] Field of Search ..................... 330/254, 278, 330/279, 285, 288, 296

[56] References Cited

U.S. PATENT DOCUMENTS

| | | | |
|---|---|---|---|
| 4,814,724 | 3/1989 | Tanigawa | 330/288 |
| 4,878,031 | 10/1989 | Main | 330/278 X |
| 5,424,682 | 6/1995 | Gomez et al. | 330/278 X |

*Primary Examiner*—Steven Mottola
*Attorney, Agent, or Firm*—Rogers & Killeen

[57] ABSTRACT

A circuit and method for controlling current gain in variable gain and automatic gain control amplifiers or attenuators in high frequency communication systems. A transistor through which the current is provided always operates at the same DC bias, independent of gain control variations. The input signal is provided to a base of the transistor whose collector provides an output current whose gain is to be controlled. An AGC current for adjusting the output current gain and a DC bias current are provided to the base of the transistor through a multi-transistor circuit so that the DC bias is independent of variation of the output current gain.

25 Claims, 3 Drawing Sheets

GAIN CONTROL CIRCUIT AND METHOD

BACKGROUND OF THE INVENTION

The present invention relates to circuits for electronically controlling signal level, and more particularly to a gain control circuit for variable gain and automatic gain control amplifiers or attenuators in high frequency communication systems.

Many circuits, particularly communication system circuits, require devices for controlling signal level. Variable gain and automatic gain control amplifiers and attenuators are typically used for this purpose, and the present invention is directed to an improvement for such devices.

A commonly used device for controlling signal level in communication systems is the differential pair attenuator. An output from a collector of either transistor in the attenuator is a scaled replica of the current input at the pair's emitters, where the amount of attenuation is a function of the applied differential voltage. In such devices an input signal and a DC bias are both scaled. However, at high attenuation the reduced DC bias affects operation of the device, causing the bandwidth to decrease and the current gain to drop.

The prior art avoids this problem by cascading several attenuator stages, each with less attenuation than a single attenuator. Cascading introduces other problems, such as the need to stack the cascaded stages which impairs low supply voltage operation, or the use of current mirrors or level shifters to connect stages which add to system supply current requirements and may reduce system bandwidth.

The present invention avoids many of these problems by operating a transistor through which the input signal is provided with a DC bias which is independent of gain control variations. The input signal is provided to a base of the transistor whose collector provides an output current whose gain is to be controlled. An AGC current for adjusting the output current gain and a DC bias current are provided to the base of the transistor through a multi-transistor circuit which ensures that the DC bias is substantially independent of variation of the output current gain.

Accordingly, it is an object of the present invention to provide a novel gain control circuit and method in which a transistor through which the input signal is provided operates with a DC bias which is substantially independent of gain control variations, thereby avoiding the problems of the prior art.

It is another object of the present invention to provide a novel gain control circuit and method in which a cell for the circuit includes a first transistor with a collector connected to an output for the cell, a grounded emitter and a base connected to an input for the cell, and an operating circuit with both an AGC current source for adjusting the output gain and a DC bias current source for providing a DC bias to the first transistor, and in which both the AGC current source and the DC bias current source are connected to the base of the first transistor through a multi-transistor circuit so that the DC bias is independent of variation in gain.

It is yet another object of the present invention to provide a novel gain control circuit and method in which a first transistor has a first terminal connected to a circuit output and a base connected to a circuit input, a first pair of serially connected transistors has a first node therebetween which is connected to the base of the first transistor, a second pair of serially connected transistors is connected to a bias current source and has an AGC current source connected to a second node therebetween, where a base of one of the second pair is connected to a base of a first one of the first pair, and in which a sixth transistor is connected to the AGC current source and has its base connected to a base of a second one of the first pair, so that a DC bias provided to the base of the first transistor is independent of gain variation.

It is still another object of the present invention to provide a novel circuit and method in which plural cells are cascaded, each cell with a transistor through which the input signal is provided which operates with a DC bias which is substantially independent of gain control variations.

It is a further object of the present invention to provide a novel circuit and method for a differential amplifier in which two transistors, one for each set of inputs and outputs, are operated with a DC bias which is substantially independent of gain control variations.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
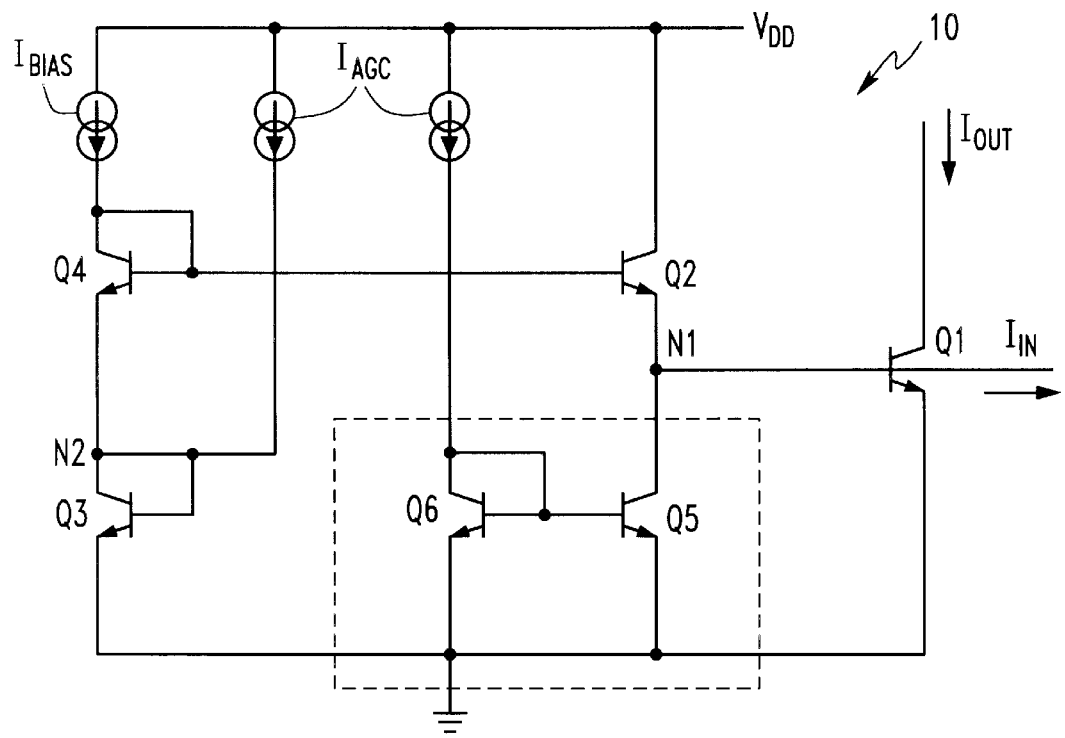
FIG. 1 is circuit diagram of an embodiment of the basic cell of the present invention.

With reference now to FIG. 1, an embodiment of the basic cell 10 of the present invention for a gain control circuit may include a first transistor Q1 having a collector connected to an output $I_{OUT}$ for the cell, a grounded emitter, and a base connected to an input $I_{IN}$ for the cell. Only a small percentage of the current applied to the base of the transistor Q1 is absorbed in the base, with most being absorbed in the emitter of the transistor Q2 at node N1. Transistor Q2 thus converts the input current to a voltage, and the voltage to an output current.

A first pair of serially connected transistors Q2 and Q5 may be connected between a potential $V_{DD}$ and ground and have a node N1 between transistors Q2 and Q5 which is connected to the base of transistor Q1. An AGC current source $I_{AGC}$ may provide a current for adjusting the gain from $I_{IN}$ to $I_{OUT}$ (while two current sources $I_{AGC}$ are shown, one such source may suffice), and a bias current source $I_{BIAS}$ may provide a DC bias current.

A second pair of serially connected transistors Q3 and Q4 may be connected between $I_{BIAS}$ and ground, and each may have its base connected to its collector. $I_{AGC}$ may be connected to a node N2 between the second pair of transistors Q3 and Q4, and a base of transistor Q4 may be connected to a base of transistor Q2. A sixth transistor Q6 may be connected between $I_{AGC}$ and ground, and have its base connected to its collector and to a base of transistor Q5. In operation, a DC bias provided to the base of transistor Q1 is independent of variation of current gain.

Preferably, all of the transistors are the same size and type, although this is not required. For example, the transistors may be bipolar junction transistors which may be either PNP or NPN, or they may be MOS transistors. Further, different sizes and types of transistors may be used. The bias currents and AGC currents may be the same or different, may vary from cell to cell in a cascade of plural cells.

An understanding of the present invention may be facilitated by the following mathematical description of the operation of the circuit and method.

If all of the transistors are the same size and matched, $$V_{BEQ1} + V_{BEQ2} = V_{BEQ3} + V_{BEQ4} \quad (1)$$

$$I_{C1}I_{C2} = I_{C3}I_{C4} \quad (2)$$

$$I_{OUT}(I_{AGC} + I_{IN}) = I_{BIAS}(I_{AGC} + I_{BIAS}) \quad (3)$$

As will be appreciated, $I_{IN} = I_{BIAS} + I_{SIG}$, where $I_{SIG}$ is the input signal level. Then, $$I_{OUT} = \frac{(I_{BIAS} + I_{AGC})I_{BIAS}}{I_{AGC} + I_{BIAS} + I_{SIG}} \quad (4)$$

$$I_{OUT} = \frac{I_{BIAS}}{1 + \frac{I_{SIG}}{I_{BIAS} + I_{AGC}}} = \frac{I_{BIAS}}{1 + x} = I_{BIAS}(1 - x + x^2 - x^3) \quad (5)$$

where $x = \frac{I_{SIG}}{I_{BIAS} + I_{AGC}}$ $$I_{OUT} = \frac{I_{BIAS}}{y + (1 - y) + x} \quad (6)$$

where $y = \frac{I_{AGC}}{I_{BIAS} + I_{AGC}}$ and $$I_{IN} = [(1 - y) + x](I_{BIAS} + I_{AGC}) \quad (7)$$

Thus, $$I_{OUT} \approx I_{BIAS}(1 - (ai) + (ai)^2 - (ai)^3) \quad (8)$$

where $a = \frac{1}{I_{BIAS} + I_{AGC}}$ ; $i = I_{SIG}$

Output current $I_{OUT}$ has the same DC bias, and an AC portion which is phase shifted 180° and is scaled by the factor, $$\frac{I_{BIAS}}{I_{BIAS} + I_{AGC}}$$

Since $I_{AGC}$ may be positive or negative, the cell is capable of gain or attenuation.

The basic cell 10 will operate at low supply voltages, such as two transistor $V_{BE}$'s (approximately 1.6V), and the total supply current is comparable to cascaded differential pairs. Further, since the transistor Q1 through which the signal passes always operates at the same DC bias which is independent of the attenuation factor, the bandwidth is also substantially independent of the current gain and cell 10 provides a wide, constant bandwidth over the entire attenuation range. As will be appreciated by those of skill in the art, the bias current may also be used to vary gain. For example, if the value of $I_{BIAS}$ in FIG. 1 decreases, attenuation will be increased without changing $I_{AGC}$.

Figure 2:
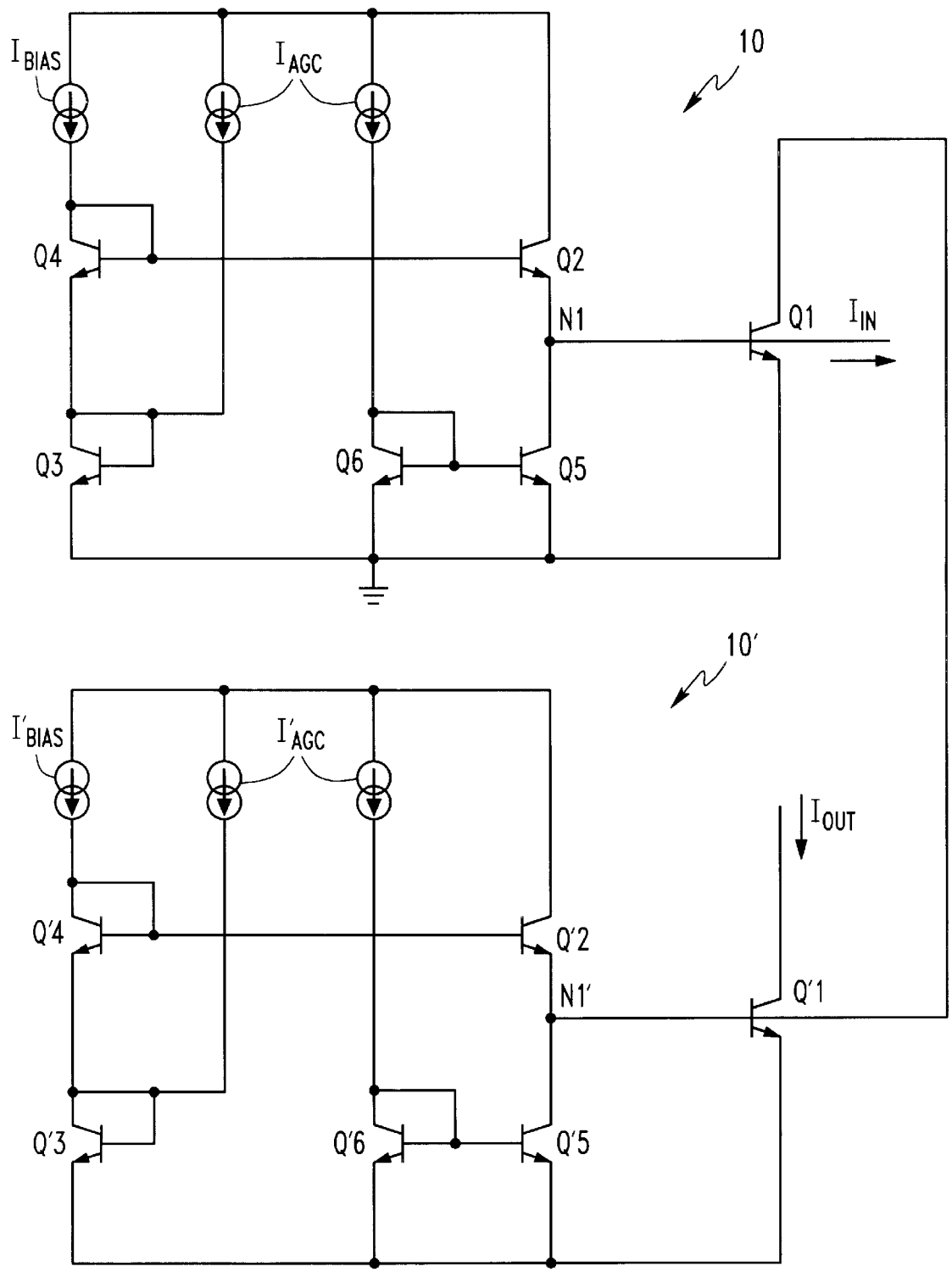
FIG. 2 is circuit diagram of cascaded cells of an embodiment of the present invention.

As may be seen in FIG. 2, plural of the cells 10 can be cascaded with no level shifting and no DC blocking capacitors or other matching networks between cells as is typical of the prior art. The output of one cell 10 may be provided as an input to the following cell 10'. Cascaded cell 10' may vary signal level with completely separate components, such as shown in FIG. 2. If the output of cell 10 becomes the input to a second identical cell 10, then $I_{OUT}$ has the same DC bias but the AC portion is scaled by a factor, $$\left(\frac{I_{BIAS}}{I_{BIAS} + I_{AGC}}\right)^2$$

If the output of the second cell 10 is the input to a third identical cell 10, then $I_{OUT}$ has the same DC bias but the AC portion has a 180° phase shift and is scaled by a factor, $$\left(\frac{I_{BIAS}}{I_{BIAS} + I_{AGC}}\right)^3$$

With two identical cells 10, an attenuation range from 0 to −45 dB is attainable.

Operation of a gain control circuit is desirably linear, and to this end it has been found that the best linearity is obtained with an even number of cascaded cells. For linear operation, the ratio x (from Equation 5) of signal current $I_{SIG}$ to the sum of $I_{BIAS}$ and $I_{AGC}$ is desirably small, with the worst case being when there is no AGC (maximum gain.) However, alternate cells have a tendency to cancel distortion, and with two cascaded cells the second cell cancels the distortion from the first cell when the AGC is zero, y=0 (from Equation 6). Therefore, the worst case overall is at some intermediate level of gain. For three cells, distortion is about the same as for a single cell with only a slight improvement when $I_{AGC}$ equals $I_{BIAS}$, y=0.5. Thus, linearity is best with an even number of stages.

Figure 3:
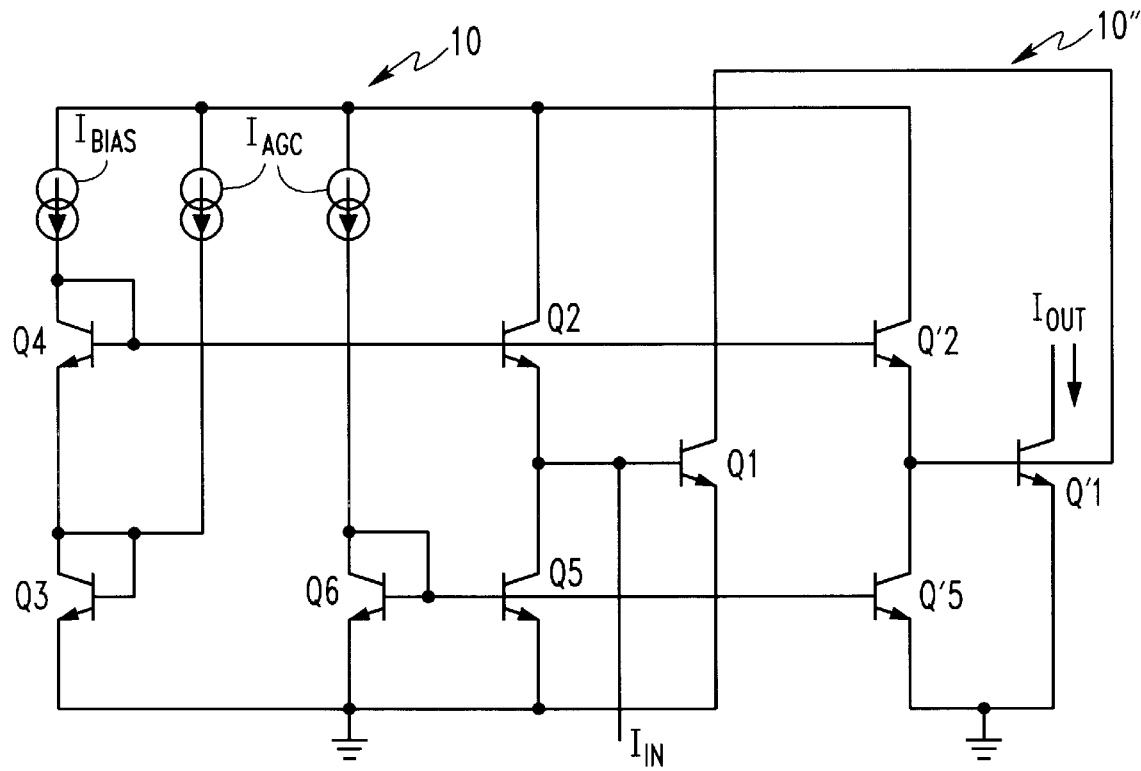
FIG. 3 is circuit diagram of a further embodiment of cascaded cells of the present invention.

In an alternative embodiment illustrated in FIG. 3, cell 10" may share the biasing portion ($I_{BIAS}$, Q4, Q3 and Q6) with another cell 10, provided the currents $I_{BIAS}$ and $I_{AGC}$ are the same and the transistors are the same size.

Figure 4:
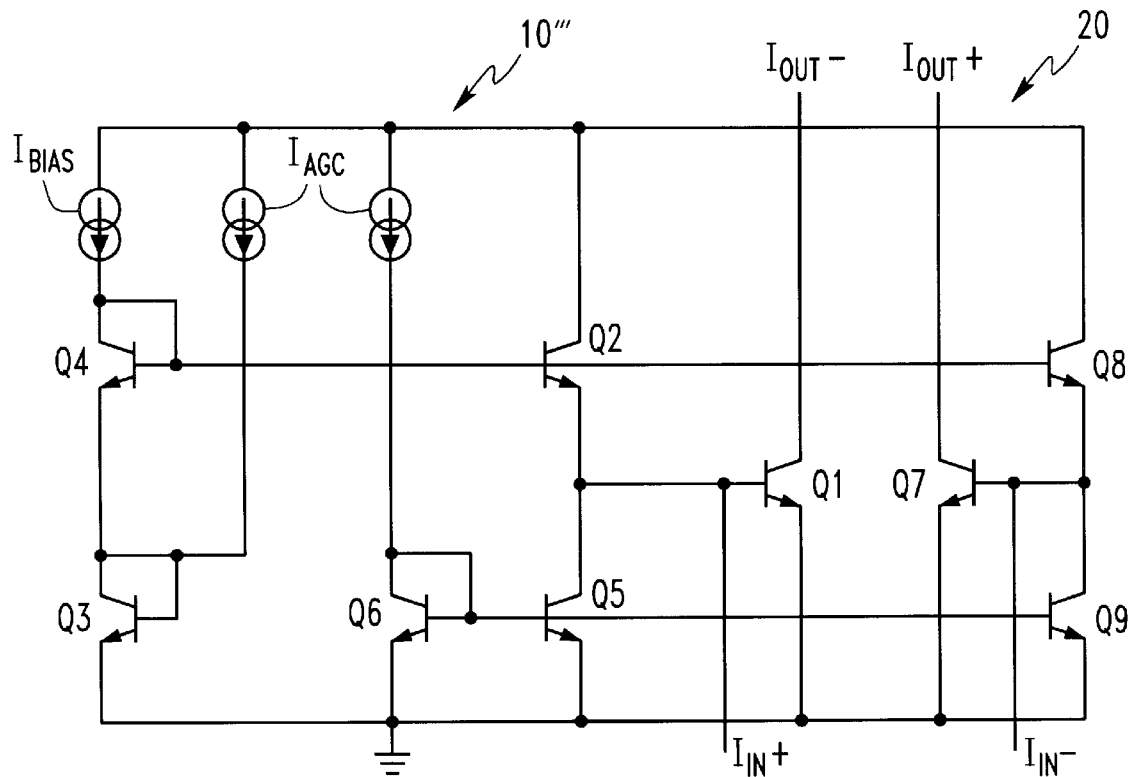
FIG. 4 is circuit diagram of an embodiment of the present invention for a differential device.

The basic cell 10 may also be adapted for use in a differential cell 20, such as illustrated in FIG. 4. Three transistors Q7–9 are added to replicate the three transistors Q1, Q2 and Q5 of cell 10''' in order to provide the second input and output for cell 20.

Figure 5:
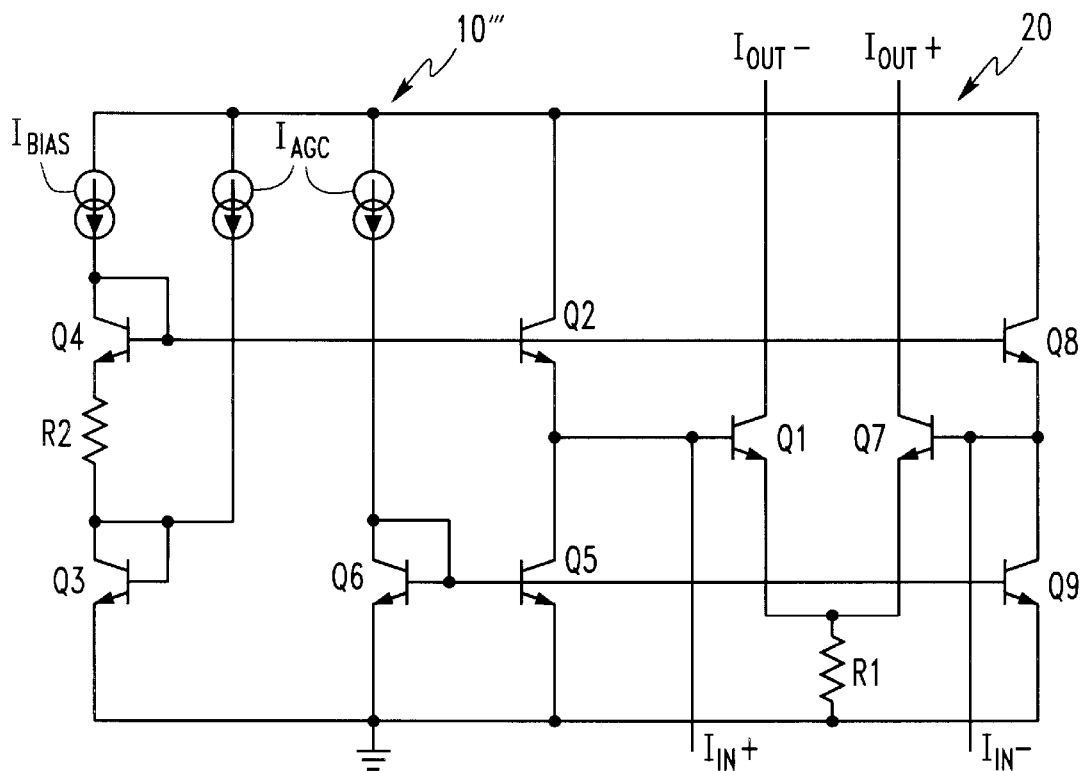
FIG. 5 is circuit diagram of a second embodiment of the present invention for a differential device.

The circuit of FIG. 5 illustrates a further embodiment in which the emitters of the transistors Q1 and Q7 are connected in common and to ground through a resistor R1. A second resistor R2 having twice the resistance value of R1 is connected between the emitter of Q4 and the collector/base of Q3.

The tying together of the emitters forms a virtual ground and essentially none of the current from the input signal passes through R1. This tends to stabilize the operating point of the transistors Q1 and Q7 with regard to the mismatch between the transistors Q1 and Q7, and it tends to balance the signal levels. The disadvantage is that distortion has its onset at a lower value and thus distortion may slightly increase as the a.c. portion of the signal increases.

The invention herein finds application in a variety of devices, including AGC devices (i.e., devices with electronically variable gain), gain control amplifiers and attenuators, and other similar devices. The invention is particularly adaptable for use in high frequency communication systems.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A gain control circuit having a cell connected between a first potential and ground, said cell comprising:
   a first transistor having a first terminal connected to an output for the cell, a grounded second terminal and a base connected to an input for the cell;
   a first pair of serially connected transistors connected between the first potential and ground, a first node between said first pair being connected to said base of said first transistor;
   an AGC current source for adjusting the a gain of an input current for the cell;
   a bias current source for providing a DC bias current;
   a second pair of serially connected transistors which are connected between said bias current source and ground, each of said second pair of transistors having its base connected to a first terminal thereof, said AGC current source being connected to a second node between said second pair of transistors, and a base of one of said second pair of transistors being connected to a base of a first one of said first pair of transistors; and
   a sixth transistor connected between said AGC current source and ground, and having its base connected to a base of a second one of said first pair of transistors and to a first terminal of said sixth transistor,
   whereby a DC bias provided to said base of said first transistor is independent of variation of gain of an input current at the input for the cell.

2. The circuit of claim 1 comprising plural ones of said cell in a cascade, wherein an output of a first one of the cells becomes an input for a second one of the cells.

3. The circuit of claim 2 comprising an even number of said plural cells.

4. The circuit of claim 1 for a differential device, the cell further comprising,
   a seventh transistor having a first terminal connected to a second output for the cell, a grounded second terminal and a base connected to a second input for the cell,
   a third pair of serially connected transistors connected between the first potential and ground, a third node between said third pair being connected to said base of said seventh transistor, and
   a base of a first one of said third pair being connected to said base of said first one of said first pair, and a base of a second one of said third pair being connected to said base of said second one of said first pair.

5. The circuit of claim 4 comprising plural ones of said cell in a cascade, wherein the outputs of a first one of the cells become the inputs for a second one of the cells.

6. The circuit of claim 1 wherein all of said transistors are NPN bipolar transistors of substantially the same size.

7. The circuit of claim 1 wherein all of said transistors are PNP bipolar transistors of substantially the same size.

8. The circuit of claim 1 wherein all of said transistors are MOS transistors of substantially the same size.

9. The circuit of claim 1 further comprising a second cell comprising,
   a seventh transistor having a first terminal connected to an output for the circuit, a grounded second terminal and a base connected to the output from said cell of claim 1,
   a third pair of serially connected transistors connected between the first potential and ground, a third node between said third pair being connected to said base of said seventh transistor, and
   a base of a first one of said third pair being connected to said base of said first one of said first pair, and a base of a second one of said third pair being connected to said base of said second one of said first pair.

10. The circuit of claim 1 in a gain control amplifier.

11. The circuit of claim 1 in a gain control attenuator.

12. The circuit of claim 1 in an automatic gain control system.

13. A gain control circuit comprising:
    a first transistor having a first terminal connected to an output for the circuit, a grounded second terminal and a base connected to an input for the circuit; and
    an operating circuit comprising an AGC current source for adjusting the a gain of an input current for the circuit and a DC bias current source for providing a DC bias to said first transistor, said AGC current source and said DC bias current source being connected to said base of said first transistor so that the DC bias is independent of variation of the gain of the input current.

14. The circuit of claim 13 wherein said operating circuit further comprises a first pair of serially connected transistors with a first node therebetween connected to said base of said first transistor.

15. The circuit of claim 14 wherein said operating circuit further comprises a second pair of serially connected transistors connected to said DC bias current source, said AGC current source being connected to a second node between said second pair of transistors, and a base of one of said second pair of transistors being connected to a base of a first one of said first pair of transistors.

16. The circuit of claim 15 wherein said operating circuit further comprises a sixth transistor connected to said AGC current source and having its base connected to a base of a second one of said first pair of transistors.

17. A method of controlling current gain comprising the steps of:
    (a) providing an input current to a base of a first transistor having a first terminal for providing an output current whose gain is to be controlled and a grounded second terminal; and
    (b) providing (i) an AGC current for adjusting the output current gain and (ii) a DC bias current to the base of the first transistor through a multi-transistor circuit so that the DC bias is independent of variation of the output current gain.

18. The method of claim 17 wherein the step of providing comprises the steps of connecting a first node between a first pair of serially connected transistors a first node to the base of the first transistor,
    connecting the AGC current to a second node between a second pair of serially connected transistors which are connected to the DC bias, wherein a base of one of the second pair of transistors is connected to a base of a first one of the first pair of transistors, and
    connecting the AGC current to a sixth transistor which has its base connected to a base of a second one of the first pair of transistors.

19. The method of claim 17 further comprising the step of providing the output current to a base of a second transistor which has a first terminal for providing a second output current whose gain is to be controlled and a grounded second terminal.

20. The method of claim 17 further comprising the steps of
    providing the output current to a base of a second transistor which has a first terminal for providing a second output current whose gain is to be controlled and a grounded second terminal; and providing (i) a second AGC current for adjusting the second output current gain and (ii) the DC bias current to the base of the second transistor so that the DC bias is independent of variation of the second output current gain.

21. A gain control circuit for a differential device comprising:

first and second input terminals;

first and second output terminals;

first and second pair of serially connected transistors connected between a first potential and ground;

first and second transistors connected respectively between said first and second output terminals and ground potential, the bases of said first and second transistors being connected respectively to said first and second input terminals and the Interconnection between the transistors of said first and second pairs of transistors;

an AGC current source;

a third transistor connected between said AGC current source and ground potential with the base thereof connected to the bases of the other one of said first and second pair of transistors;

a source of DC bias current;

a third pair of serially connected transistors connected between said DC bias current source and ground potential with the base of one of said pair being connected to the bases of a first transistor of said first and second pair of transistors.

22. The circuit of claim 21 wherein said first and second transistors are connected together to form a virtual ground and to ground potential through a first resistor; and wherein the transistors of said third pair of transistors are connected through a second resistor.

23. The circuit of claim 22 wherein the resistance of said second resistor is twice the value of the resistance of said first impedance.

24. A gain control circuit for a device comprising:

a input terminal;

an output terminal;

a current mirror;

a first transistor connected in series with said mirror between a first potential and ground;

a second transistor connected between said output terminal and ground potential with the base thereof being connect ed to said input terminal and to the interconnection of said first transistor and said mirror;

a source of DC bias current; and a first pair of serially connected transistors connected between said DC bias current source and ground potential with the base of one of said pair being connected to the base of said first transistor.

25. The circuit of claim 24 wherein said current mirror comprises a source of current and second and third transistors, said source being in series with said third transistor and said second transistor being connected in series with said first transistor, the bases of said second and third transistors being common.

* * * * *